(12) United States Patent
Yu et al.

(10) Patent No.: US 9,000,750 B2
(45) Date of Patent: Apr. 7, 2015

(54) METHOD AND APPARATUS FOR TEMPERATURE ADJUSTED CONTROL OF BATFET CURRENT SENSING

(75) Inventors: Baiying Yu, Santa Clara, CA (US); Nihit Bajaj, San Diego, CA (US); Troy Stockstad, Chandler, AZ (US); Eric I. Mikuteit, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 228 days.

(21) Appl. No.: 13/558,117

(22) Filed: Jul. 25, 2012

(65) Prior Publication Data

US 2014/0028285 A1 Jan. 30, 2014

(51) Int. Cl.
*G01R 21/14* (2006.01)
*G01R 11/185* (2006.01)

(52) U.S. Cl.
CPC .................................. *G01R 11/185* (2013.01)

(58) Field of Classification Search
CPC ............ H01C 7/00; G01K 7/00; G01K 7/01; G01K 2007/00
USPC ..................... 324/105, 431, 433; 327/83, 378, 327/512–513, 538, 540, 541, 543; 374/183, 374/185, 178, 1
See application file for complete search history.

(56) References Cited

U.S. PATENT DOCUMENTS

| | | | | |
|---|---|---|---|---|
| 3,480,852 A * | 11/1969 | Hung | | 323/279 |
| 6,016,047 A | 1/2000 | Notten et al. | | |
| 6,087,888 A * | 7/2000 | Inokuchi | | 327/513 |
| 6,166,591 A * | 12/2000 | Schultz et al. | | 327/544 |
| 6,888,413 B1 * | 5/2005 | Adams et al. | | 331/17 |
| 6,956,753 B1 | 10/2005 | Ananias | | |
| 6,958,590 B1 | 10/2005 | Vaananen | | |
| 7,154,291 B2 * | 12/2006 | Turner | | 324/762.09 |
| 7,579,900 B2 * | 8/2009 | Durbaum | | 327/513 |
| 8,035,397 B1 | 10/2011 | Jaoude et al. | | |
| 2005/0206455 A1 | 9/2005 | Yamazaki et al. | | |
| 2011/0095818 A1 | 4/2011 | Sullivan | | |

FOREIGN PATENT DOCUMENTS

| | | |
|---|---|---|
| EP | 2042879 A1 | 4/2009 |
| JP | 2000338146 A | 12/2000 |

OTHER PUBLICATIONS

International Search Report and Written Opinion—PCT/US2013/052122—ISA/EPO—Oct. 28, 2013.

* cited by examiner

*Primary Examiner* — Arleen M Vasquez
*Assistant Examiner* — Robert P Alejnikov, Jr.

(57) ABSTRACT

A method and apparatus for providing a temperature sensing loop used in connection with a current sensing component, such as a BATFET, in order to compensate for variations in the BATFET's resistance due to temperature variations. The temperature sensing loop detects a temperature of the BATFET and regulates the gate voltage of the BATFET based on the detected temperature in order to compensate for changes in the BATFET's resistance. The temperature sensing feedback loop maintains the BATFET at a constant resistance for current sensing through negative feedback control. The BATFET and temperature sensing loop can be provided as components of an on-chip fuel gauging application for a UE.

14 Claims, 6 Drawing Sheets

METHOD AND APPARATUS FOR TEMPERATURE ADJUSTED CONTROL OF BATFET CURRENT SENSING

BACKGROUND

1. Field

The present disclosure relates generally to a method and apparatus for temperature adjusted control of BATFET current sensing, and more particularly to such control of BATFET current sensing in fuel gauging applications.

2. Background

Wireless communication systems are widely deployed to provide various telecommunication services such as telephony, video, data, messaging, and broadcasts. Typical wireless communication systems may employ multiple-access technologies capable of supporting communication with multiple users by sharing available system resources (e.g., bandwidth, transmit power). Examples of such multiple-access technologies include code division multiple access (CDMA) systems, time division multiple access (TDMA) systems, frequency division multiple access (FDMA) systems, orthogonal frequency division multiple access (OFDMA) systems, single-carrier frequency division multiple access (SC-FDMA) systems, and time division synchronous code division multiple access (TD-SCDMA) systems.

These multiple access technologies have been adopted in various telecommunication standards to provide a common protocol that enables different wireless devices to communicate on a municipal, national, regional, and even global level. An example of an emerging telecommunication standard is Long Term Evolution (LTE). LTE is a set of enhancements to the Universal Mobile Telecommunications System (UMTS) mobile standard promulgated by Third Generation Partnership Project (3GPP). It is designed to better support mobile broadband Internet access by improving spectral efficiency, lower costs, improve services, make use of new spectrum, and better integrate with other open standards using OFDMA on the downlink (DL), SC-FDMA on the uplink (UL), and multiple-input multiple-output (MIMO) antenna technology. However, as the demand for mobile broadband access continues to increase, there exists a need for further improvements in LTE technology. Preferably, these improvements should be applicable to other multi-access technologies and the telecommunication standards that employ these technologies.

The demand for precise fuel gauges for smart phone batteries continues to increase. Such a fuel gauge in user equipment (UE) can be accomplished via current sensing. Typical current sensing relies on an external precision sensing resistor which has a low Temperature Coefficient (TC). Such precision sensing resistors achieve current sensing by inserting a series resistor in the high current path. The voltage drop on the sense resistor is measured and converted to current information in order to track the battery's capacity. A disadvantage of this method of precision sensing is a non-zero insertion loss, e.g., inserting the sense resistor in the high current path degrades the battery efficiency, which reduces the amount of talk time that can be supported by the battery. The industry strives for zero insertion in order to improve battery efficiency.

Thus, a need exists for a precise fuel gauge that avoids degradation of the battery efficiency.

SUMMARY

In order to accurately monitor the fuel level of a battery in a more effective manner, current sensing can be performed through an on-chip Battery Field-Effect Transistor (BATFET). On-chip BATFET is a switch component that is part of charging circuitry to allow the phone to either stop charging or discharging the battery when needed. The on-chip BATFET provides a more effective current sensing method due to the fact that no extra insertion resistance is placed in the high current path from the battery. Such on-chip BATFET measurements increase the efficiency of the battery measurement, which results in a longer potential talk time.

In order to maintain accurate measurements across temperature variations, a temperature sensing loop can be used in connection with the BATFET in order to compensate for variations in the BATFET's resistance due to temperature variations. For example, the temperature sensing loop can be applied to detect the temperature of the BATFET and to regulate the gate voltage of the BATFET based on the detected temperature in order to compensate for changes in the resistance. This provides an elegant temperature sensing and control loop which tracks the temperature variation of an on-chip BATFET and maintains it at a constant resistance for current sensing through negative feedback control. This can be applied to enable accurate fuel gauging using an on-chip BATFET.

By tracking the temperature variation of the on-chip BATFET and modulating the gate voltage of the BATFET to achieve a constant resistance, the BATFET and temperature control loop can perform precise current sensing.

The BATFET and feedback loop enable zero insertion current sensing that maximizes battery efficiency while still achieving the required accuracy in the fuel level measurement because it can be accomplished without inserting an additional resistor into the voltage line. The BATFET and control loop, may be provided on a power management integrated circuit (PMIC).

Aspects may include an apparatus for temperature sensing control for a current sensing component. The apparatus may include a current sensing component inserted in a voltage line in order to measure current in the voltage line. The apparatus may further include a feedback loop component that tracks a temperature of the current sensing component and modulates the resistance of the current sensing component based on the tracked temperature in order to maintain the current sensing component at a substantially constant resistance.

Additional aspects may include a method of adjusting the resistance of a current sensing component to adjust for temperature and process variations. A first voltage is received at a current sensing component inserted in a voltage line. The temperature of the current sensing component is detected via a feedback loop component. Then, the resistance of the current sensing component is adjusted via the feedback loop component based on the detected temperature.

DETAILED DESCRIPTION

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well known structures and components are shown in block diagram form in order to avoid obscuring such concepts.

Figure 1:
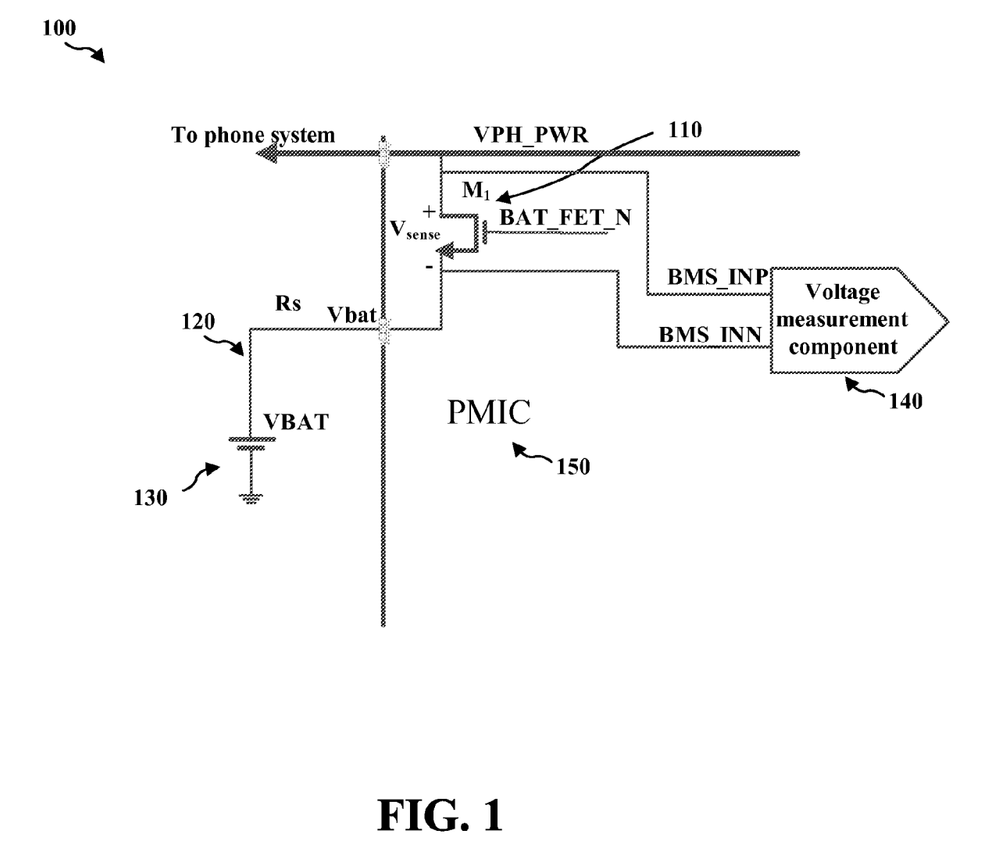
FIG. 1 is a diagram illustrating an example system for performing current sensing via a BATFET.

In order to accurately monitor the fuel level of a battery in a more effective manner, current sensing can be performed through an on-chip Battery Field-Effect Transistor (BATFET). On-chip BATFET is a switch component that is part of charging circuitry to allow the phone to either stop charging or discharging the battery when needed. The on-chip BATFET provides a more effective current sensing method due to the fact that no extra insertion resistance is placed in the high current path from the battery. Such on-chip BATFET measurements increase the efficiency of the battery measurement, which results in a longer potential talk time. Additionally, the BATFET can perform current sensing without any external sensing resistors, because the sensing can implemented using an on-chip BATFET. FIG. 1 illustrates an example diagram for performing BATFET sensing of the fuel level in a battery according to aspects presented herein.

On-chip current sensing with a BATFET makes high side current sensing very attractive because it enables a minimum routing resistance in the high current path by avoiding any additional sensing resistors in the high current path and because it minimizes the number of pins needed for both on-chip BATFET and on-chip fuel gauge sensing. However, a BATFET has a very low impedance (~10 mOhm) and a high temperature coefficient $R_{ds}$ (TC=4000 ppm/° C.). This results in a ±24% variation when the temperature varies from −30° C. to 90° C. Thus, a BATFET on its own is not feasible for the accuracy required in precision current sensing. The technique that uses BATFET for current sensing through current mirror usually has a 5% error at high current and 10% or higher error for low current.

Requirements for on-chip sensing include, e.g., a minimal resistance added in a high current path of the battery, low temperature sensitivity, and limited process variation. For an accurate measurement, a TC<100 ppm/° C. is typically required.

Any use of a BATFET on its own for such current sensing would require a microprocessor to constantly adjust the measured BATFET voltage in order to compensate for the resistance drift based on temperature.

In order to address the problems associated with inaccuracy across temperature variations, a temperature sensing loop can be used in connection with the BATFET in order to compensate for variations in the BATFET's resistance due to temperature variations. For example, the temperature sensing loop can be applied to detect a temperature of the BATFET and to regulate the gate voltage of the BATFET based on the detected temperature in order to compensate for changes in the resistance.

By tracking the temperature variation of the on-chip BATFET and modulating the gate voltage of the BATFET to achieve a constant resistance, the BATFET and temperature control loop can perform precise current sensing. This enables a BATFET resistance $R_{ds}$ having an extremely low TC (e.g., TC<100 ppm/° C.) to be used for precise fuel gauge applications. Such a BATFET enables highly accurate current sensing, e.g., for monitoring the fuel level of a battery in a UE, because the current information from the BATFET can be precisely derived.

FIG. 1 illustrates an example circuit diagram 100 for performing BATFET sensing of the fuel level in a battery 130. As illustrated in FIG. 1, a BATFET 110 can be provided in the high current path 120 from the battery 130. BATFET may be connected to a voltage measurement component 140 as a part of the fuel gauge. BATFET 110 may be provided on a power management integrated circuit (PMIC) 150. FIG. 1 illustrates that current sensing may be performed in the high current path without providing an additional resistor in the high current path. This leads to higher efficiency and provides a longer talk time for a UE. No external sensing resistor is required, because sensing is implemented using a pre-existing on-chip BATFET.

Figure 2:
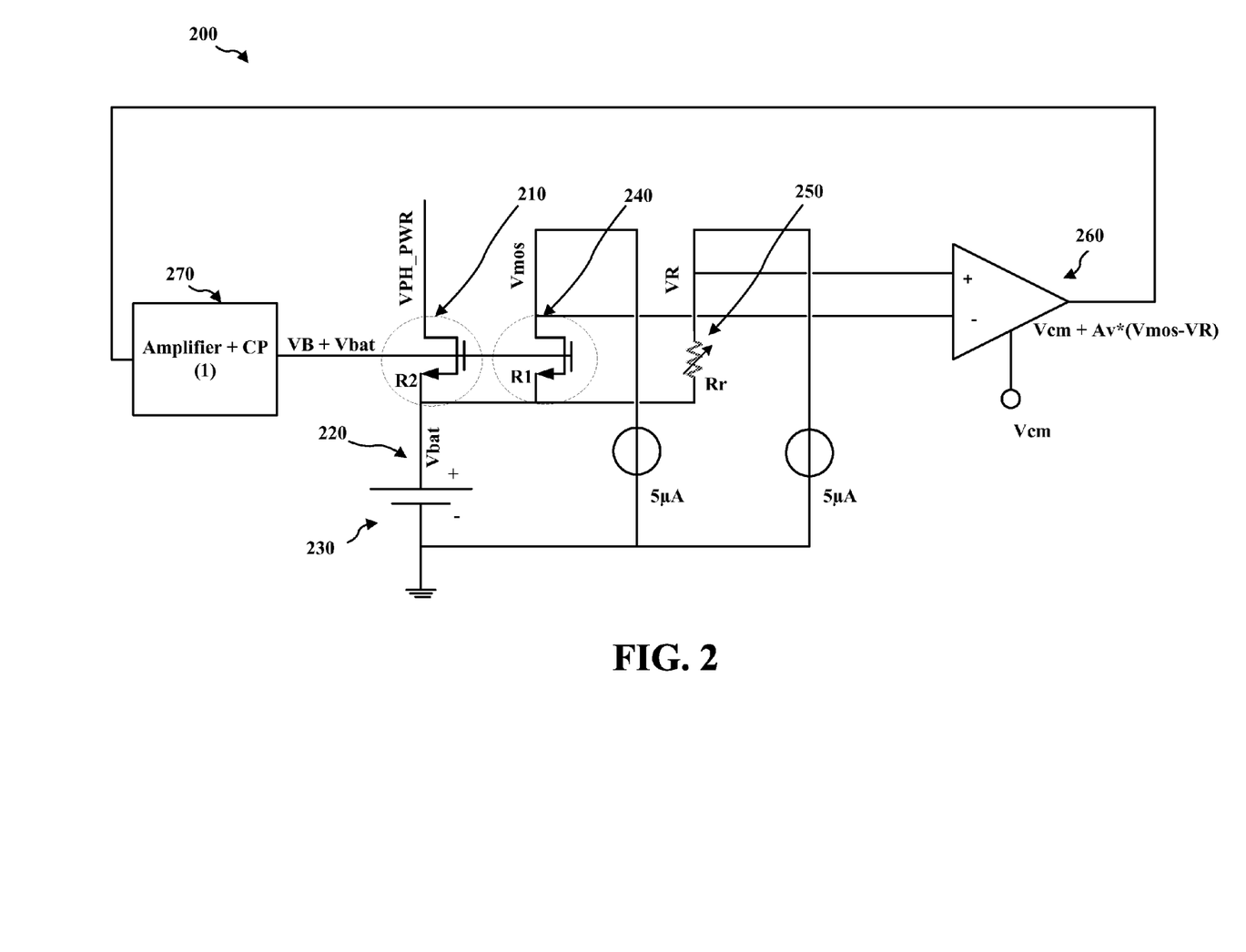
FIG. 2 is a diagram illustrating an example system for adjusting the resistance of a current sensing component for temperature changes.

FIG. 2 illustrates such a BATFET 210 having negative feedback control. The illustrated BATFET receives the high side voltage Vbat 220 from the battery 230 at its source and outputs voltage VPH_PWR from its drain. The gate of the BATFET 210 is connected to a negative feedback loop comprising BATFET replica 240, programmable resistor 250, and error amplifier 260. BATFET 210 has a resistance R2. BATFET 210 may be resized in order to achieve a nominal 10 mOhm.

BATFET replica 240 receives Vbat at its source and outputs a voltage Vmos from its drain. BATFET replica 240 has a resistance R1. BATFET replica 240 outputs Vmos to an input of error amplifier 260. The gate of replica 240 connected to the gate of BATFET 210. BATFET replica 240 is on a much smaller scale than BATFET 210, e.g., on the order of 500,000 to 1. For example, the BATFET may be approximately 10 mohm and the BATFET replica may be approximately 5 kohm. A typical reference voltage may be 25 mV.

The programmable resistor 250 receives Vbat and outputs Vr to an input of error amplifier 260. The programmable resistor 250 has a resistance Rr and a very low temperature coefficient. Rr is programmable in order to compensate for the process variation between R1 and Rr. Rr is programmed to substantially match R1 at a certain temperature. For example, Rr may be set to substantially match R1 at room temperature with less than 10% variation. This variation can be calibrated through a one-time calibration. The programmable resistor 250 may comprise an on-chip p+poly having TC=−100 ppm/° C.

Alternately, instead of the programmable resistor 250, the sense point of the BATFET replica may be adjusted. For example, the BATFET replica may comprise a plurality of field effect transistors (FET) in series such that the BATFET replica is programmable by selecting an amount of the plurality of FETs used in the BATFET replica.

Figure 3:
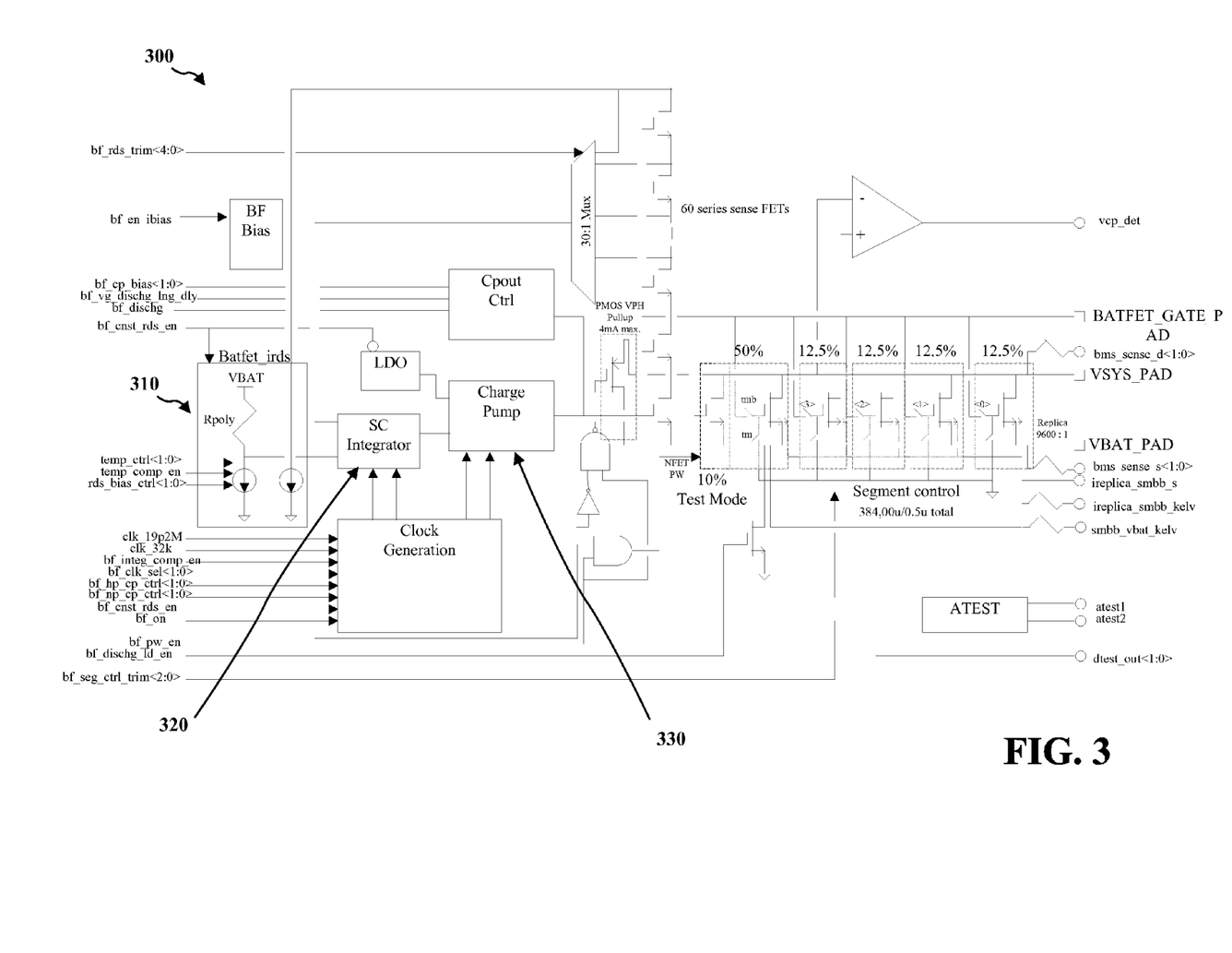
FIG. 3 is a diagram illustrating an example of a system using BATFET and a feedback loop.

The BATFET replica may comprise a series of sense FETs biased by the sense current, in order to achieve a high ratio. Additionally, a multiplexer (MUX) may be used to trim the sense point of the BATFET replica to center the loop bias point, e.g. RDS(on), as illustrated in FIG. 3.

Error amplifier 260 receives Vr at a first input and Vmos at a second input and outputs an amplified difference between the two received voltages. In this example, error amplifier 260 outputs Av*(Vmos−Vr). The gain provided by the feedback amplifier biases the BATFET to the appropriate level to equalize the reference and sense inputs.

The output of error amplifier 260 is input to amplifier and charge pump (CP) 270 which output VB+Vbat to the gate of BATFET 210 and BATFET replica 240 in order to adjust for changes in the resistance due to a temperature variation. Thus, the resistance of both BATFET 210 and BATFET replica 240 track each other. Error amplifier 260 may be implemented as a switch cap integrator (SC Integrator). Such an SC integrator may comprise an auto-zeroed integrator that compensates for input offset, common mode rejection errors from the amplifier, gain error, and power supply changes. For example, with a 75 kHz clock, the loop bandwidth (BW) may be approximately 12.5 kHz. Amplifier 270, e.g., a track and hold amplifier, decouples settling requirements and the charge pump capacitive load.

When the temperature varies, the output impedance of BATFET 210 and its replica 240 will vary also. However, due to the low TC, Rr of programmable resistor 250 will remain the same. Although Rr was programmed to match R1 to compensate process mismatch between R1 and Rr within 10% difference, R1 varies with the change in temperature in the same manner as R2 of BATFET 210, while Rr does not vary. The voltage difference between Vmos from replica 240 and VR from programmable resistor 250 will be sensed and amplified by error amplifier 260. Thereafter, the amplified difference undergoes control via a track and hold amplifier and a charge pump 270 before being output to the gate of BATFET 210. Through this negative feedback, the gate voltage of BATFET 210 will be regulated to keep Vmos at the same voltage level of VR. By modulating the gate voltage of BATFET 210, R2 can be maintained at a constant resistance.

Although the resistance $R_{ds}$ of a BATFET may have a ±40% process variation, a one-time calibration can be performed on an Automatic Testing Equipment (ATE) so its resistance can be stored in non-volatile memory. Or $R_{ds}$ can be made with segments and its resistance can be coarsely adjusted where low resistance variation is demanded. For example, with two programmable bits, the process variation can be reduced to ±10%.

A BATFET and feedback loop enables zero insertion current sensing, e.g., that maximizes battery efficiency while still achieving the required high accuracy.

The BATFET and control loop, may be provided on a PMIC, e.g., PMIC 150 as illustrated in FIG. 1. A PMIC may comprise integrated circuits or a system block in a system-on-a-chip device for managing power consumption. A PMIC may provide battery management, voltage regulation, or charging functions, etc.

FIG. 3 illustrates a detailed block diagram 300 of a BATFET 310 and feedback loop. Feedback loop may comprise an integrator 320 having a clock rate between 75 kHz to 10 kHz and a charge pump 330 having a charge pump clock rate between 19.2 MHz to 32 kHz. A track and hold buffer may be provided between integrator 320 and charge pump 330 to allow separate clock control. The BATFET contains five segments so its total resistance can be programmable to reduce process variation.

Although examples have been described in connection with a fuel gauge and with a fuel gauge on a UE, the aspects described herein can be applied to other situations requiring stable on chip MOSFET or BATFET performance across a variable temperature range.

Figure 4:
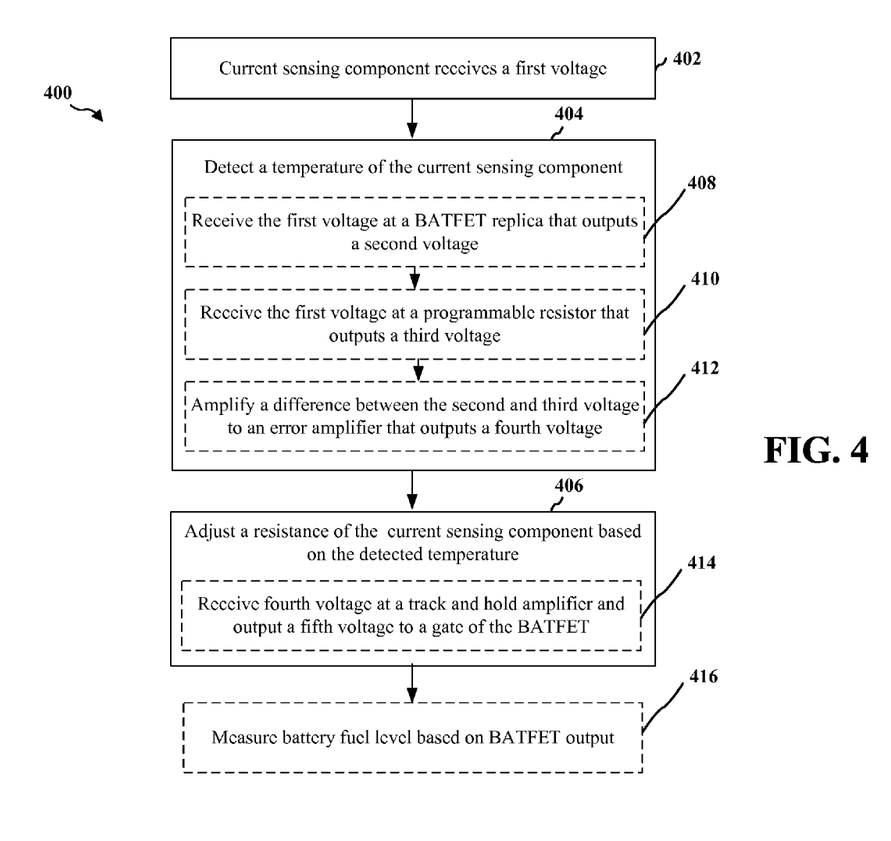
FIG. 4 is a flow chart of a method of temperature sensing control for a current sensing component.

FIG. 4 illustrates a flow chart 400 of a method of adjusting a resistance of a current sensing component to adjust for temperature and process variations. The method may be performed by a UE, and more specifically by a current sensing component and feedback loop provided on a PMIC of the UE. The current sensing component may be inserted in the voltage line on the top side of the battery. At step 402, the current sensing component receives a first voltage. As the current sensing component may be inserted on the top side of the battery, the first voltage may comprise a high side voltage from the battery. At step 404, a temperature of the current sensing component is detected via a feedback loop component. At 406, a resistance of the current sensing component is adjusted via the feedback loop component based on the detected temperature. The resistance of the current sensing component is adjusted based on the tracked temperature in order to regulate the resistance of the current sensing component to a substantially constant value. By tracking the temperature of the current sensing component and adjusting its resistance accordingly, the resistance of the current sensing component is adjusted in real time in order to maintain it at a substantially constant value. By maintaining a constant resistance, an accurate measurement of the current can be provided regardless of the temperature.

The current sensing component may comprise any of a Metal-Oxide-Semiconductor Field-Effect Transistor (MOSFET) and a BATFET, as illustrated e.g., in FIGS. 1-2. For example, as illustrated in FIG. 2, the current sensing component may comprise a BATFET. The gate voltage of the BATFET may be modulated based on the detected temperature in order to adjust the resistance of the BATFET.

Additional, optional steps are illustrated with a dotted line. At step 408, the first voltage is received at a BATFET replica. The BATFET replica then outputs a second voltage. In the example, in FIG. 2, BATFET replica 240 receives Vbat and outputs Vmos. At step 410, the first voltage is also received at a programmable resistor that outputs a third voltage. In the example in FIG. 2, programmable resistor 250 receives Vbat and outputs VR. At 412, a difference between the second voltage and the third voltage is amplified at an error amplifier that outputs a fourth voltage. The error amplifier may comprise a switch cap integrator. In FIG. 2, error amplifier 260 amplifies the difference between Vmos and VR and outputs Av*(Vmos−VR). At 414, the fourth voltage is received at a track and hold amplifier, and a fifth voltage is output from the track and hold amplifier to a gate of the BATFET. FIG. 2 illustrates CP 270 receiving the output from the error amplifier 260 and outputting VB+Vbat to the gate of BATFET 210 in order to regulate the resistance of BATFET 210 to adjust for any changes in resistance due to a change in temperature.

Although aspects may be used for other applications, at step 416, the fuel level of the battery may be measured based on an output from the current sensing component, e.g., BATFET. The BATFET and feedback loop may be comprised within a UE, e.g., as a component of the UE's PMIC. The resistance of the current sensing component may be programmed in segments through digital control in order to reduce process variation. In this case, a single calibration may be performed to eliminate process variation in the resistance of the current sensing component.

Figure 5:
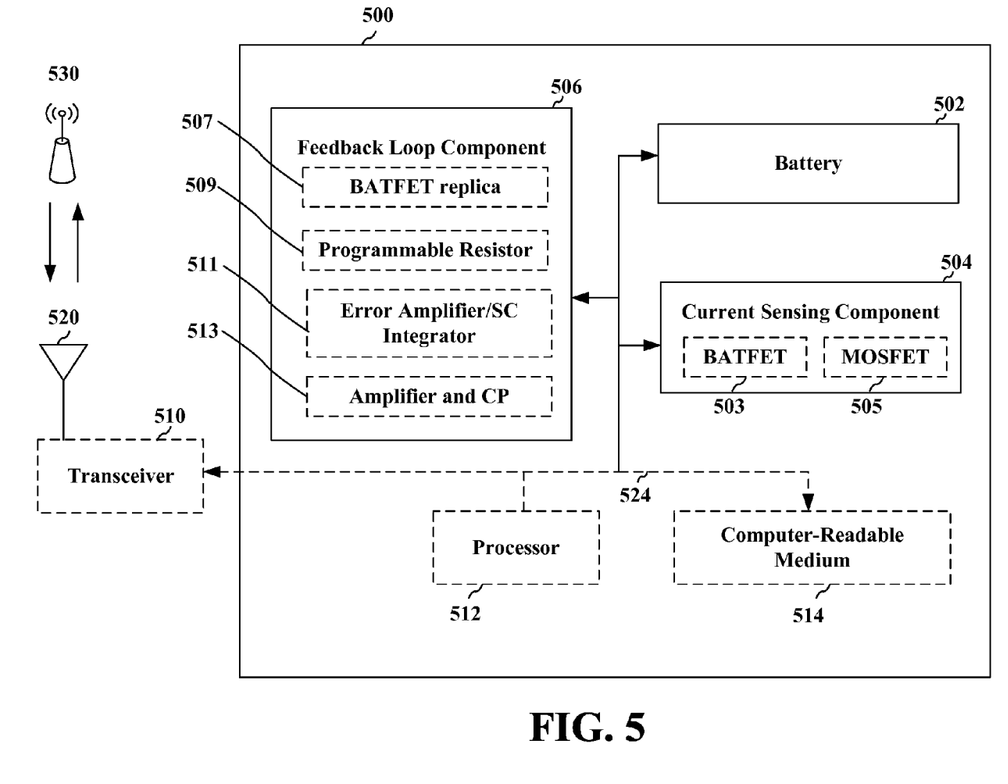
FIG. 5 is a diagram illustrating an example of a hardware implementation for an apparatus employing a temperature sensing control for a current sensing component.

FIG. 5 is a diagram 500 illustrating an example of a hardware implementation for an apparatus 500 employing temperature sensing control for a current sensing component. The apparatus comprises a current sensing component 504. The current sensing component 504 is inserted in a voltage line from a battery 502 of the apparatus and measures current in the voltage line. The current sensing component may comprise any of a BATFET 503 and a MOSFET 505. The apparatus comprises a feedback loop component 506 that tracks a temperature of the current sensing component and modulates a resistance of the current sensing component based on the tracked temperature. The feedback loop modulates the resistance of the current sensing component in order to regulate the resistance of the current sensing component to a substantially constant resistance.

The feedback loop component may detect the temperature of the BATFET and modulate the gate voltage of the BATFET based on the detected temperature. The BATFET may receive a first voltage in the voltage line. The feedback loop component may comprise a BATFET replica 513 that receives the first voltage and outputs a second voltage, a programmable resistor 509 that receives the first voltage and outputs a third voltage, an error amplifier 511 that receives the second voltage and the third voltage and outputs a fourth voltage, and a second amplifier 513 that receives the fourth voltage and outputs a fifth voltage to the gate of the BATFET 503. The error amplifier 511 may comprise a switch cap integrator. The BATFET 503 may be configured to receive a high side voltage from the battery 502 at a source of the BATFET.

The BATFET may measure a fuel level of the battery. The apparatus may comprise a UE, and the BATFET may measure a fuel level of the UE's battery. The current sensing component and feedback loop component may be comprised in a PMIC of the UE.

In this example, the UE may further comprise a transceiver 510 having an antenna 520 for communicating with node 530. Such a UE may further include a processor 512 and computer readable medium 514. The transceiver 510 provides a means for communicating with various other apparatus over a transmission medium. The processor 512 is responsible for general processing, including the execution of software stored on the computer-readable medium 514. The software, when executed by the processor 512, may cause the system to perform the various functions described supra for any particular apparatus. The computer-readable medium 514 may also be used for storing data that is manipulated by the processor 512 when executing software.

Figure 6:
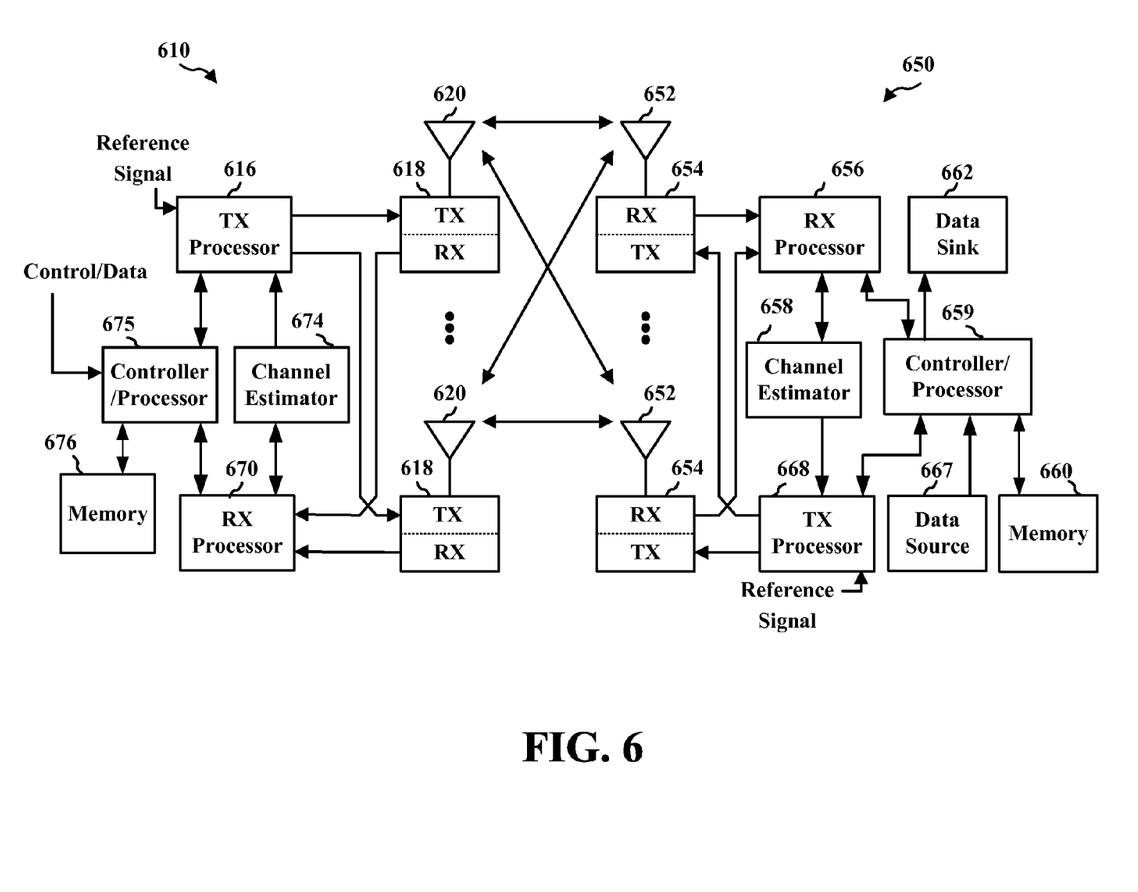
FIG. 6 is a diagram illustrating an example of an evolved Node B and user equipment in an access network.

FIG. 6 is a block diagram of an evolved Node B (eNB) 610 in communication with a UE 650 in an access network. In the downlink (DL), upper layer packets from the core network are provided to a controller/processor 675. The controller/processor 675 implements the functionality of the L2 layer. In the DL, the controller/processor 675 provides header compression, ciphering, packet segmentation and reordering, multiplexing between logical and transport channels, and radio resource allocations to the UE 650 based on various priority metrics. The controller/processor 675 is also responsible for hybrid automatic repeat request (HARQ) operations, retransmission of lost packets, and signaling to the UE 650.

The transmit (TX) processor 616 implements various signal processing functions for the L1 layer (i.e., physical layer). The signal processing functions includes coding and interleaving to facilitate forward error correction (FEC) at the UE 650 and mapping to signal constellations based on various modulation schemes (e.g., binary phase-shift keying (BPSK), quadrature phase-shift keying (QPSK), M-phase-shift keying (M-PSK), M-quadrature amplitude modulation (M-QAM)). The coded and modulated symbols are then split into parallel streams. Each stream is then mapped to an orthogonal frequency division multiple access (OFDM) subcarrier, multiplexed with a reference signal (e.g., pilot) in the time and/or frequency domain, and then combined together using an Inverse Fast Fourier Transform (IFFT) to produce a physical channel carrying a time domain OFDM symbol stream. The OFDM stream is spatially precoded to produce multiple spatial streams. Channel estimates from a channel estimator 674 may be used to determine the coding and modulation scheme, as well as for spatial processing. The channel estimate may be derived from a reference signal and/or channel condition feedback transmitted by the UE 650. Each spatial stream is then provided to a different antenna 620 via a separate transmitter 618TX. Each transmitter 618TX modulates an RF carrier with a respective spatial stream for transmission.

At the UE 650, each receiver 654RX receives a signal through its respective antenna 652. Each receiver 654RX recovers information modulated onto an RF carrier and provides the information to the receive (RX) processor 656. The RX processor 656 implements various signal processing functions of the L1 layer. The RX processor 656 performs spatial processing on the information to recover any spatial streams destined for the UE 650. If multiple spatial streams are destined for the UE 650, they may be combined by the RX processor 656 into a single OFDM symbol stream. The RX processor 656 then converts the OFDM symbol stream from the time-domain to the frequency domain using a Fast Fourier Transform (FFT). The frequency domain signal comprises a separate OFDM symbol stream for each subcarrier of the OFDM signal. The symbols on each subcarrier, and the reference signal, is recovered and demodulated by determining the most likely signal constellation points transmitted by the eNB 610. These soft decisions may be based on channel estimates computed by the channel estimator 658. The soft decisions are then decoded and deinterleaved to recover the data and control signals that were originally transmitted by the eNB 610 on the physical channel. The data and control signals are then provided to the controller/processor 659.

The controller/processor 659 implements the L2 layer. The controller/processor can be associated with a memory 660 that stores program codes and data. The memory 660 may be referred to as a computer-readable medium. In the UL, the controller/processor 659 provides demultiplexing between transport and logical channels, packet reassembly, deciphering, header decompression, control signal processing to recover upper layer packets from the core network. The upper layer packets are then provided to a data sink 662, which represents all the protocol layers above the L2 layer. Various control signals may also be provided to the data sink 662 for L3 processing. The controller/processor 659 is also responsible for error detection using an acknowledgement (ACK) and/or negative acknowledgement (NACK) protocol to support HARQ operations.

In the UL, a data source 667 is used to provide upper layer packets to the controller/processor 659. The data source 667 represents all protocol layers above the L2 layer. Similar to the functionality described in connection with the DL transmission by the eNB 610, the controller/processor 659 implements the L2 layer for the user plane and the control plane by providing header compression, ciphering, packet segmentation and reordering, and multiplexing between logical and transport channels based on radio resource allocations by the eNB 610. The controller/processor 659 is also responsible for HARQ operations, retransmission of lost packets, and signaling to the eNB 610.

Channel estimates derived by a channel estimator 658 from a reference signal or feedback transmitted by the eNB 610 may be used by the TX processor 668 to select the appropriate coding and modulation schemes, and to facilitate spatial processing. The spatial streams generated by the TX processor 668 are provided to different antenna 652 via separate transmitters 654TX. Each transmitter 654TX modulates an RF carrier with a respective spatial stream for transmission.

The UL transmission is processed at the eNB 610 in a manner similar to that described in connection with the receiver function at the UE 650. Each receiver 618RX receives a signal through its respective antenna 620. Each receiver 618RX recovers information modulated onto an RF carrier and provides the information to a RX processor 670. The RX processor 870 may implement the L1 layer.

The controller/processor 675 implements the L2 layer. The controller/processor 675 can be associated with a memory 676 that stores program codes and data. The memory 876 may be referred to as a computer-readable medium. In the UL, the control/processor 675 provides demultiplexing between transport and logical channels, packet reassembly, deciphering, header decompression, control signal processing to recover upper layer packets from the UE 650. Upper layer packets from the controller/processor 675 may be provided to the core network. The controller/processor 675 is also responsible for error detection using an ACK and/or NACK protocol to support HARQ operations.

Several aspects have been presented with reference to various apparatus and methods. These apparatus and methods will be described in the following detailed description and illustrated in the accompanying drawings by various blocks, modules, components, circuits, steps, processes, algorithms, etc. (collectively referred to as "elements"). These elements may be implemented using electronic hardware, computer software, or any combination thereof. Whether such elements are implemented as hardware or software depends upon the particular application and design constraints imposed on the overall system.

By way of example, an element, or any portion of an element, or any combination of elements may be implemented with a "processing system" that includes one or more processors. Examples of processors include microprocessors, microcontrollers, digital signal processors (DSPs), field programmable gate arrays (FPGAs), programmable logic devices (PLDs), state machines, gated logic, discrete hardware circuits, and other suitable hardware configured to perform the various functionality described throughout this disclosure. One or more processors in the processing system may execute software. Software shall be construed broadly to mean instructions, instruction sets, code, code segments, program code, programs, subprograms, software modules, applications, software applications, software packages, routines, subroutines, objects, executables, threads of execution, procedures, functions, etc., whether referred to as software, firmware, middleware, microcode, hardware description language, or otherwise.

Accordingly, in one or more exemplary embodiments, the functions described may be implemented in hardware, software, firmware, or any combination thereof. If implemented in software, the functions may be stored on or encoded as one or more instructions or code on a computer-readable medium. Computer-readable media includes computer storage media. Storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Disk and disc, as used herein, includes compact disc (CD), laser disc, optical disc, digital versatile disc (DVD), floppy disk and Blu-ray disc where disks usually reproduce data magnetically, while discs reproduce data optically with lasers. Combinations of the above should also be included within the scope of computer-readable media.

Furthermore, various aspects are described herein in connection with a terminal, which can be a wired terminal or a wireless terminal A terminal can also be called a system, device, subscriber unit, subscriber station, mobile station, mobile, mobile device, remote station, remote terminal, access terminal, user terminal, communication device, user agent, user device, or user equipment (UE). A wireless terminal may be a cellular telephone, a satellite phone, a cordless telephone, a Session Initiation Protocol (SIP) phone, a wireless local loop (WLL) station, a personal digital assistant (PDA), a handheld device having wireless connection capability, a computing device, or other processing devices connected to a wireless modem. Moreover, various aspects are described herein in connection with a base station. A base station may be utilized for communicating with wireless terminal(s) and may also be referred to as an access point, a Node B, or some other terminology.

Moreover, the term "or" is intended to man an inclusive "or" rather than an exclusive "or." That is, unless specified otherwise, or clear from the context, the phrase "X employs A or B" is intended to mean any of the natural inclusive permutations. That is, the phrase "X employs A or B" is satisfied by any of the following instances: X employs A; X employs B; or X employs both A and B. In addition, the articles "a" and "an" as used in this application and the appended claims should generally be construed to mean "one or more" unless specified otherwise or clear from the context to be directed to a singular form.

It is understood that the specific order or hierarchy of steps in the processes disclosed is an illustration of exemplary approaches. Based upon design preferences, it is understood that the specific order or hierarchy of steps in the processes may be rearranged. Further, some steps may be combined or omitted. The accompanying method claims present elements of the various steps in a sample order, and are not meant to be limited to the specific order or hierarchy presented.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." Unless specifically stated otherwise, the term "some" refers to one or more. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed as a means plus function unless the element is expressly recited using the phrase "means for."

What is claimed is:

1. An apparatus for temperature adjusted control for a current sensing component, comprising:
 a current sensing component inserted in a voltage line, wherein the current sensing component measures current in the voltage line; and
 a feedback loop component that tracks a temperature of the current sensing component and modulates a resistance of the current sensing component based on the tracked temperature wherein the current sensing component comprises one of a Metal-Oxide-Semiconductor Field-Effect Transistor (MOSFET) and a Battery Field-Effect Transistor (BATFET), and further wherein the current sensing component comprises a BATFET, and wherein the feedback loop component detects a temperature of the BATFET and modulates a gate voltage of the BATFET based on the detected temperature, and further wherein the BATFET receives a first voltage in the voltage line, and wherein the feedback loop component comprises:
  a BATFET replica that receives the first voltage and outputs a second voltage;
  a programmable resistor that receives the first voltage and outputs a third voltage;
  an error amplifier that receives the second voltage and the third voltage and outputs a fourth voltage;
  and a second amplifier that receives the fourth voltage and outputs a fifth voltage to a gate of the BATFET.

2. An apparatus for temperature adjusted control for a current sensing component, comprising:
  a current sensing component inserted in a voltage line, wherein the current sensing component measures current in the voltage line; and
a feedback loop component that tracks a temperature of the current sensing component and modulates a resistance of the current sensing component based on the tracked temperature wherein the current sensing component comprises one of a Metal-Oxide-Semiconductor Field-Effect Transistor (MOSFET) and a Battery Field-Effect Transistor (BATFET), and further wherein the current sensing component comprises a BATFET, and wherein the feedback loop component detects a temperature of the BATFET and modulates a gate voltage of the BATFET based on the detected temperature, and further wherein the BATFET receives a first voltage in the voltage line, and wherein the feedback loop component comprises:
  a BATFET replica that receives the first voltage and outputs a second voltage, wherein the BATFET replica comprises a plurality of field effect transistors (FET) in series such that a sense point of the BATFET replica is programmable by selecting an amount of the FETs used in the BATFET replica;
  an error amplifier that receives the second voltage and the third voltage and outputs a fourth voltage;
  and a second amplifier that receives the fourth voltage and outputs a fifth voltage to a gate of the BATFET.

3. The apparatus of claim 2, wherein the error amplifier comprises a switch cap integrator.

4. The apparatus of claim 2, wherein the BATFET is configured to receive a high side voltage from a battery at a source of the BATFET.

5. The apparatus of claim 4, wherein the BATFET measures the fuel level of the battery.

6. The apparatus of claim 5, wherein the apparatus is comprised in a user equipment.

7. The apparatus of claim 6, wherein the apparatus is comprised in a power management integrated circuit (PMIC) of the user equipment.

8. A method of adjusting a resistance of a current sensing component to adjust for temperature and process variations, the method comprising:
  receiving a first voltage at a current sensing component inserted in a voltage line;
  detecting a temperature of the current sensing component via a feedback loop component; and
  adjusting a resistance of the current sensing component via the feedback loop component based on the detected temperature; wherein the current sensing component comprises a BATFET, the method further comprising:
  modulating a gate voltage of the BATFET based on the detected temperature in order to adjust the resistance of the BATFET; and further comprising
  receiving the first voltage at a BATFET replica that outputs a second voltage;
  receiving the first voltage at a programmable resistor that outputs a third voltage;
  amplifying a difference between the second voltage and the third voltage at an error amplifier that outputs a fourth voltage;
  receiving the fourth voltage at a track and hold amplifier; and
  outputting a fifth voltage from the track and hold amplifier to a gate of the BATFET.

9. A method of adjusting a resistance of a current sensing component to adjust for temperature and process variations, the method comprising:
  receiving a first voltage at a current sensing component inserted in a voltage line;
  detecting a temperature of the current sensing component via a feedback loop component; and
  adjusting a resistance of the current sensing component via the feedback loop component based on the detected temperature; wherein the current sensing component comprises a BATFET, the method further comprising:
modulating a gate voltage of the BATFET based on the detected temperature in order to adjust the resistance of the BATFET; and further comprising
  receiving the first voltage at a BATFET replica that outputs a second voltage, wherein the BATFET replica comprises a plurality of field effect transistors (FET) in series;
  adjusting a sense point of the BATFET replica by selecting an amount of the FETs used in the BATFET replica;
  amplifying a difference between the second voltage and the third voltage at an error amplifier that outputs a fourth voltage;
  receiving the fourth voltage at a track and hold amplifier; and
  outputting a fifth voltage from the track and hold amplifier to a gate of the BATFET.

10. The method of claim 9, wherein the error amplifier comprises a switch cap integrator.

11. The method of claim 9, wherein the first voltage is a high side voltage from a battery.

12. The method of claim 11, further comprising:
  measuring a fuel level of the battery based on an output from the BATFET.

13. The method of claim 12, wherein the BATFET and feedback loop are comprised in a user equipment.

14. The method of claim 13, wherein the BATFET and feedback loop are comprised in a power management integrated circuit (PMIC) of the user equipment.

* * * * *